(12) United States Patent  (10) Patent No.: US 8,937,512 B1
Huang et al.  (45) Date of Patent: Jan. 20, 2015

(54) VOLTAGE-CONTROLLED OSCILLATOR

(71) Applicant: Taiwan Semiconductor Manufacturing Co., Ltd., Hsinchu (TW)

(72) Inventors: Bo-Jr Huang, Tainan (TW); Nan-Hsin Tseng, Tainan (TW); Wei-Hao Kao, Hsinchu (TW); Ping-Han Tsai, New Taipei (TW); Wei-Pin Changchien, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/062,847

(22) Filed: Oct. 24, 2013

(51) Int. Cl.
*H03K 3/03* (2006.01)
*H03B 28/00* (2006.01)

(52) U.S. Cl.
CPC .................................. *H03B 28/00* (2013.01)
USPC ............................................... 331/57; 331/45

(58) Field of Classification Search
USPC ........................................................ 331/57, 45
See application file for complete search history.

(56) References Cited

U.S. PATENT DOCUMENTS

| | | | | |
|---|---|---|---|---|
| 4,408,168 A | * | 10/1983 | Higuchi | 331/57 |
| 5,081,429 A | * | 1/1992 | Atriss et al. | 331/57 |
| 8,860,512 B2 | * | 10/2014 | Schimper | 331/57 |
| 2005/0040901 A1 | * | 2/2005 | Bostak et al. | 331/57 |

* cited by examiner

*Primary Examiner* — Joseph Chang
(74) *Attorney, Agent, or Firm* — McDermott Will & Emery LLP

(57) ABSTRACT

A voltage-controlled oscillator is disclosed. The voltage-controlled oscillator includes an inverter circuit configured to output an oscillation signal. The first inverter circuit includes a complementary transistor pair and a transistor string. The complementary transistor pair includes a first switch transistor and a second switch transistor. The second switch transistor is connected to the first switch transistor, in which a first terminal of the second switch transistor is connected to a second terminal of the first switch transistor. The first delaying unit includes at least one delaying transistor. A first terminal of the at least one delaying transistor is connected to a control terminal of the second switch transistor. A second terminal of the at least one delaying transistor is connected to a control terminal of the first switch transistor. A control terminal of the at least one delaying transistor is configured to receive a voltage control signal.

20 Claims, 14 Drawing Sheets

US 8,937,512 B1

VOLTAGE-CONTROLLED OSCILLATOR

BACKGROUND

Phase-locked loops (PLLs) are a key component in modern IC designs. The PLL can be used in various electrical circuits, such as clock recovery circuits, frequency synthesizers, and frequency and phase modulators. In general, the PLL uses a voltage-controlled oscillator (VCO) to provide an oscillation signal with a desired frequency. The VCO used in the PLL is an LC-tank VCO or a ring-based VCO. The ring-based VCO has a compact size and a wider bandwidth, making the ring-based VCO more popular than the LC-tank VCO in certain types of IC design.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
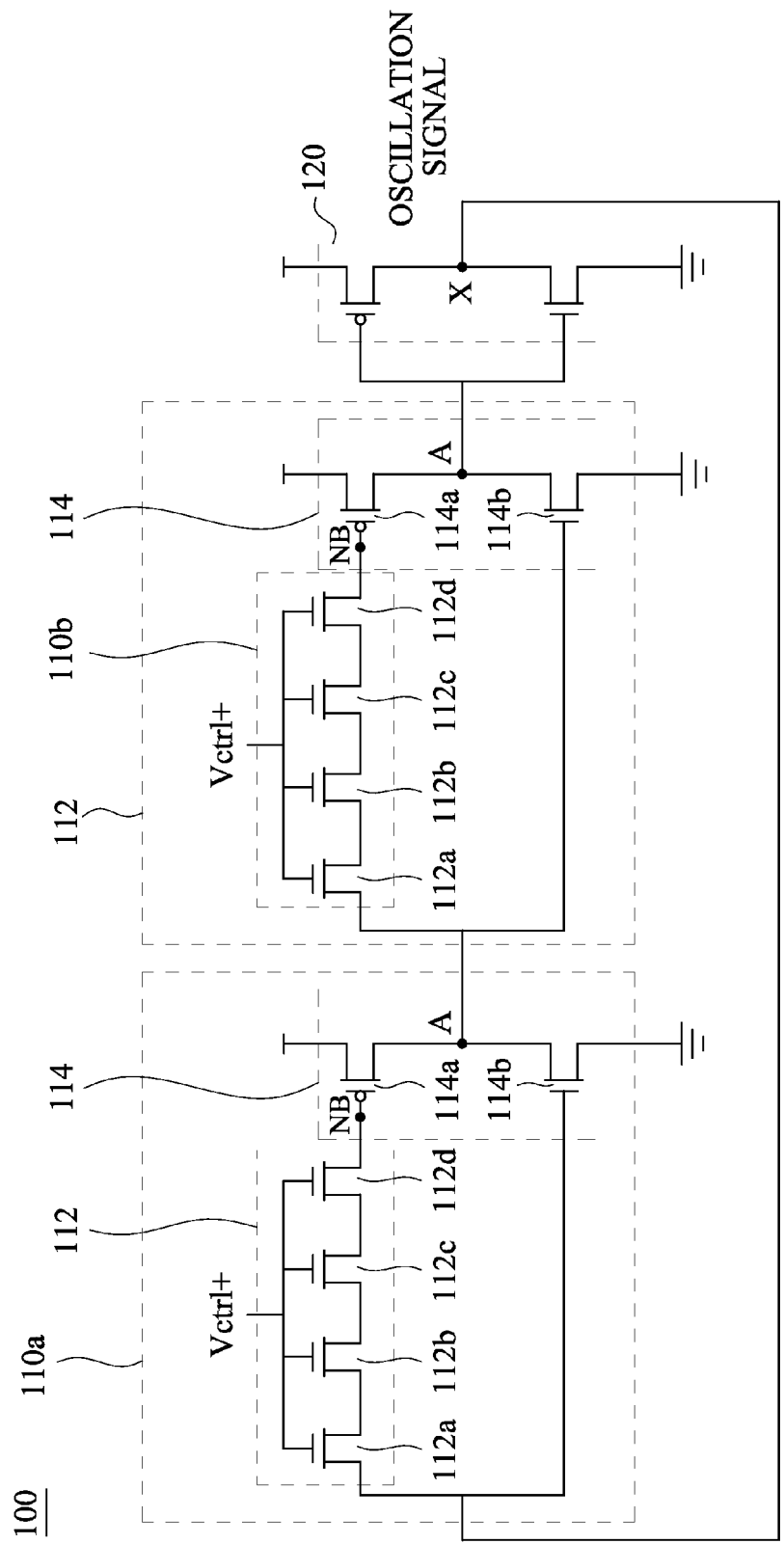
FIG. 1 is a schematic diagram showing a circuit of a ring-based voltage-controlled oscillator (VCO) in accordance with various embodiments of the present disclosure.

FIG. 1 is a schematic diagram showing a circuit of a ring-based voltage-controlled oscillator (VCO) 100 in accordance with various embodiments of the present disclosure. The ring-based VCO 100 includes inverter circuits 110a-110b and an output stage 120, in which the inverter circuits 110a-110b and the output stage 120 are electrically connected in series. The number of the inverter circuits 110a-110b in FIG. 1 is given for illustrative purposes. Other numbers of inverter circuits are within the contemplated scope of the present disclosure. The number of the inverter circuits is determined in accordance with user's demands. For example, the number of the inverter circuits is 2 in the present embodiment, but the number is not limited thereto.

The output stage 120 is configured to output an oscillation signal at the node X, and the oscillation signal is then sent back to the inverter circuits 110a-110b to form a feedback loop. In some embodiments, the output stage 120 is an inverter including a complementary transistor pair as shown in FIG. 1. In some other embodiments, the output stage 120 is a NAND gate.

Each of the inverter circuits 110a-110b includes a delaying unit 112 and a complementary transistor pair 114. The delaying unit 112 includes at least one delaying transistor. For this illustration, the delaying unit 112 includes 4 delaying transistors 112a-112d. The number of the delaying transistors in FIG. 1 is given for illustrative purposes. Other numbers of the delaying transistor are within the contemplated scope of the present disclosure. The number of the delaying transistor is determined in accordance with user's demands. In addition, for this illustration, the delaying transistors 112a-112d of the delaying unit 112 are N-type transistors. In various embodiments, the delaying transistors 112a-112d of the delaying unit 112 are P-type transistors.

The delaying transistors 112a-112d of the delaying unit 112 are electrically connected in series, and gate electrodes of the delaying transistors 112a-112d are configured to receive a control voltage Vctrl+. For this illustration, a drain electrode of the delaying transistor 112b is electrically connected to a source electrode of the delaying transistor 112a, and a source electrode of the delaying transistor 112b is electrically connected to a drain electrode of the delaying transistor 112c. The control voltage Vctrl+ is configured to control the frequency of the oscillation signal outputted by the ring-based VCO 100. For this illustration, the control voltage Vctrl+ is a high voltage that is sufficient to turn on the delaying transistors 112a-112d of the delaying unit 112.

The complementary transistor pair 114 includes a P-type transistor 114a and an N-type transistor 114b. The P-type transistor 114a and the N-type transistor 114b are electrically connected in series. For this illustration, a drain electrode of the P-type transistor 114a is electrically connected to a drain electrode of the N-type transistor 114b at a node A to form the complementary transistor pair 114. As shown in FIG. 1, a gate electrode of the P-type transistor 114a is electrically connected to the source electrode of the delaying transistor 112d at a node NB, and a gate electrode of the N-type transistor 114b is electrically connected to the drain electrode of the delaying transistor 112a. Further, a source electrode of the P-type transistor 114a is configured to receive a reference voltage which, in some embodiments, is a power voltage or a high voltage, and a source electrode of the N-type transistor 114b is configured to receive another reference voltage which, in some embodiments, is a ground voltage.

Figure 1A:
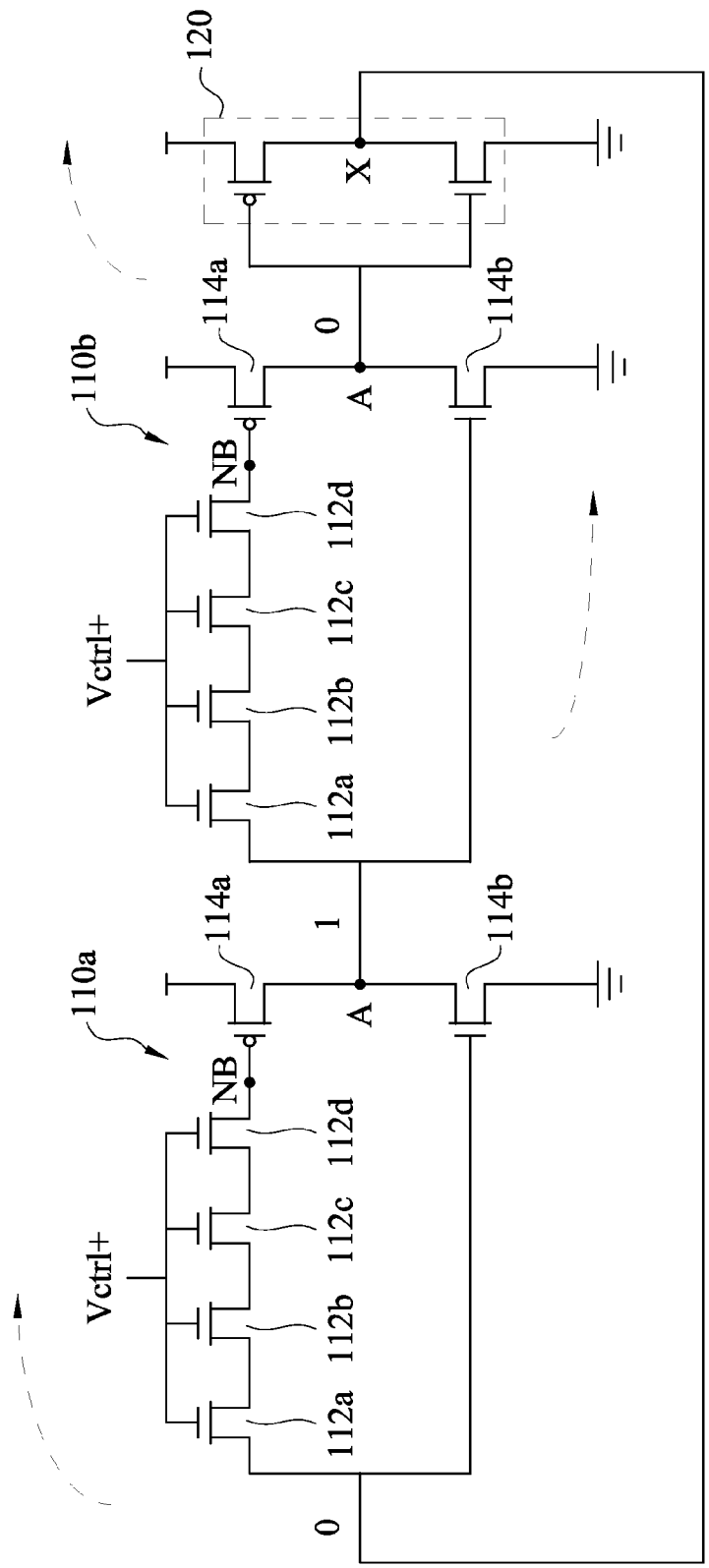
FIG. 1A and FIG. 1B are diagrams showing the operations of the ring-based VCO in accordance with various embodiments of the present disclosure.
Figure 1B:
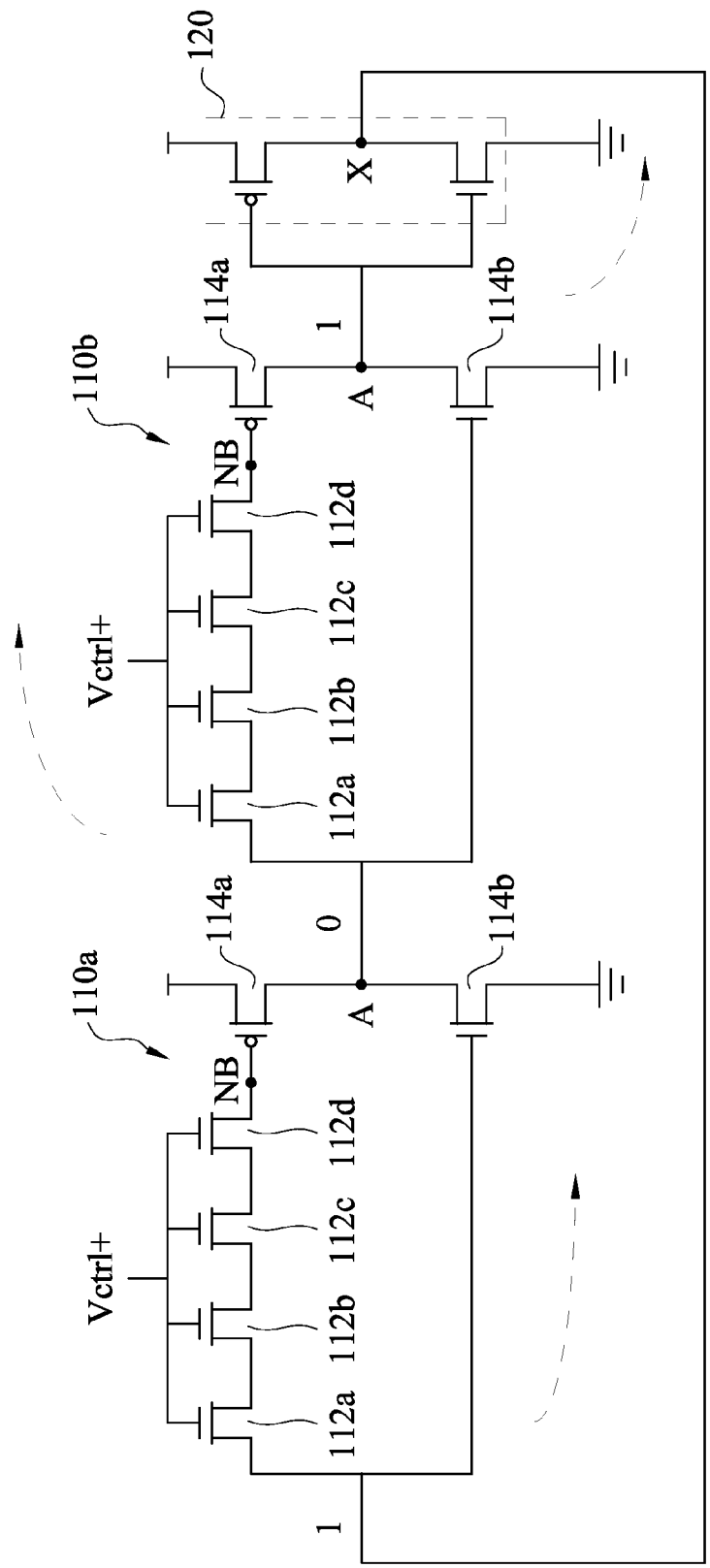

FIG. 1A and FIG. 1B are diagrams showing the operations of the ring-based VCO 100 in accordance with various embodiments of the present disclosure. In operation, as shown in FIG. 1A, when a logic "0" signal is inputted to the inverter circuit 110a, the logic "0" signal is applied on the drain electrode of the delaying transistor 112a of the inverter circuit 110a, and the logic "0" signal is then delayed by the delaying transistors 112a-112d. The delayed logic "0" signal is presented at the node NB. In this case, because the gate electrodes of the P-type transistor 114a and the N-type transistor 114b receive the delayed logic "0" signal and the inputted logic "0" signal respectively, the P-type transistor 114a is turned on and the N-type transistor 114b is turned off, thereby generating a logic "1" signal at the node A of the inverter circuit 110a.

Thereafter, the logic "1" signal is inputted to the inverter circuit 110b. The logic "1" signal is applied on the drain electrode of the delaying transistor 112a of the inverter circuit 110b, and the logic "1" signal is then delayed by the delaying transistors 112a-112d. The delayed logic "1" signal is presented at the node NB. In this case, because the gate electrodes of the P-type transistor 114a and the N-type transistor 114b receive the delayed logic "1" signal and the inputted logic "1" signal respectively, the P-type transistor 114a is turned off and the N-type transistor 114b is turned on, thereby generating a logic "0" signal at the node A of the inverter circuit 110b.

Thereafter, the logic "0" signal is inputted to the output stage 120. For this illustration, the output stage 120 is an inverter. Thus, the logic "0" signal is inverted to generate a logic "1" signal at the node X of the output stage 120 shown in FIG. 1A.

As shown in FIG. 1B, the logic "1" signal at the node X is outputted and sent back to the inverter circuit 110a. When the logic "1" signal is inputted to the inverter circuit 110a, the logic "1" signal is applied on the drain electrode of the delaying transistor 112a of the inverter circuit 110a, and the logic "1" signal is then delayed by the delaying transistors 112a-112d. The delayed logic "1" signal is presented at the node NB. In this case, because the gate electrodes of the P-type transistor 114a and the N-type transistor 114b receive the delayed logic "1" signal and the inputted logic "1" signal respectively, the P-type transistor 114a is turned off and the N-type transistor 114b is turned on, thereby generating a logic "0" signal at the node A of the inverter circuit 110a.

Thereafter, the logic "0" signal is inputted to the inverter circuit 110b. The logic "0" signal is applied on the drain electrode of the delaying transistor 112a of the inverter circuit 110b, and the logic "0" signal is then delayed by the delaying transistors 112a-112d. The delayed logic "0" signal is presented at the node NB. In this case, because the gate electrodes of the P-type transistor 114a and the N-type transistor 114b receive the delayed logic "0" signal and the logic "0" signal respectively, the P-type transistor 114a is turned on and the N-type transistor 114b is turned off, thereby generating a logic "1" signal at the node A of the inverter circuit 110b.

Thereafter, the logic "1" signal is inputted to the output stage 120, an then the logic "1" signal is inverted to generate a logic "0" signal at the node X of the output stage 120 shown in FIG. 1B.

As a result, the logic "1" signal and the logic "0" signal are outputted by the output stage 120 periodically, thereby generating the oscillation signal. Further, the frequency of the oscillation signal is determined in accordance with the control voltage Vctrl+. As shown in FIG. 1A and FIG. 1B, the control voltage Vctrl+ is applied on the gated electrodes of the delaying transistors 112a-112d, and thus the time required for the signal to pass through the delaying transistors 112a-112d is determined in accordance with the voltage level of the control voltage Vctrl+. When the voltage level of the control voltage Vctrl+ is changed, the frequency of the oscillation signal is changed accordingly.

Figure 1C:
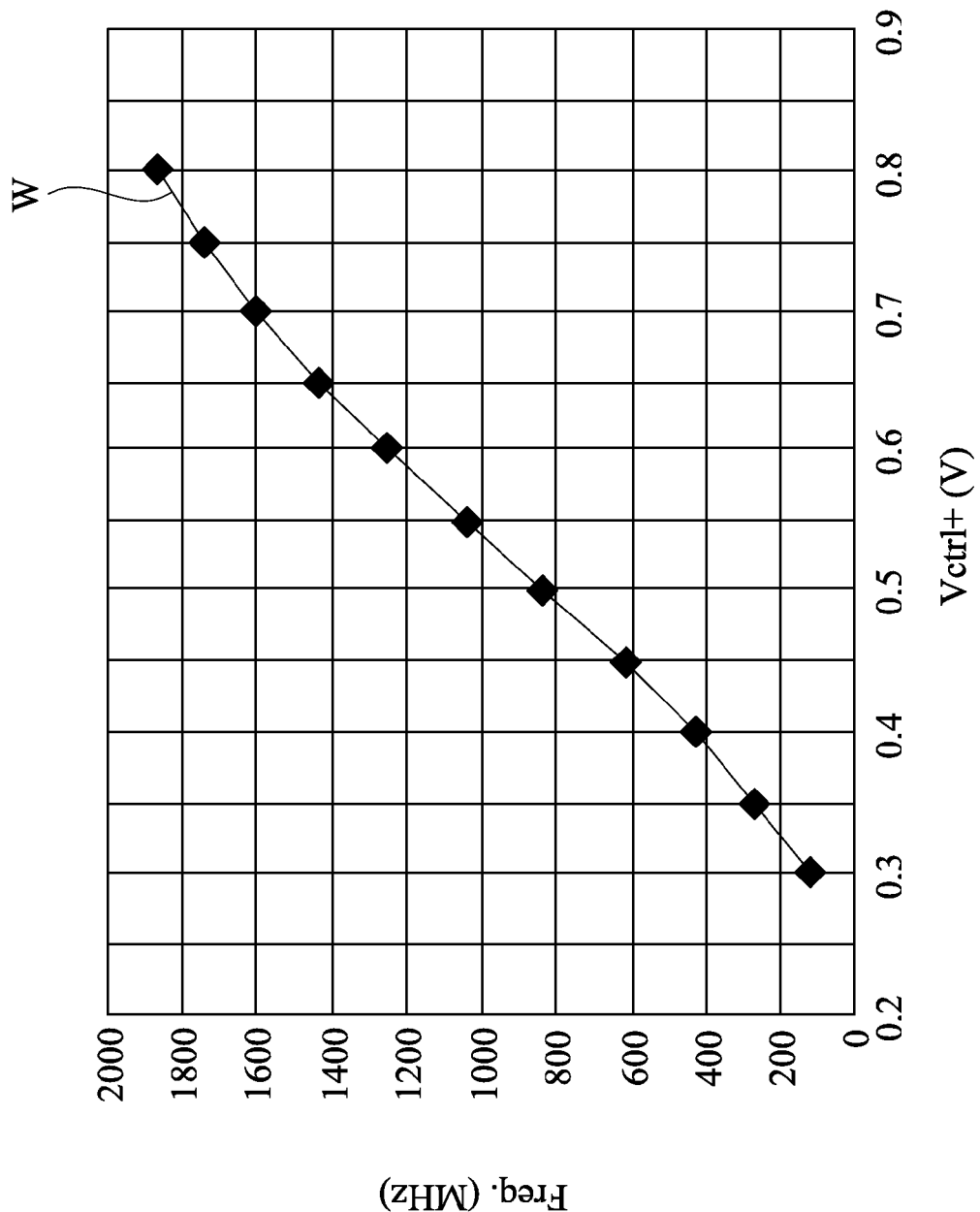
FIG. 1C is a diagram showing the relation between the voltage level of the control voltage and the frequency of the oscillation signal of the ring-based VCO in accordance with various embodiments of the present disclosure.

FIG. 1C is a diagram showing the relation between the voltage level of the control voltage Vctrl+ and the frequency of the oscillation signal of the ring-based VCO 100 in accordance with various embodiments of the present disclosure. In FIG. 1C, the relation between the voltage level of the control voltage Vctrl+ and the frequency of the oscillation signal is represented by a curve W. The curve W has a good linearity within a wide frequency range from 128 MHz to 1.86 GHz.

Figure 2:
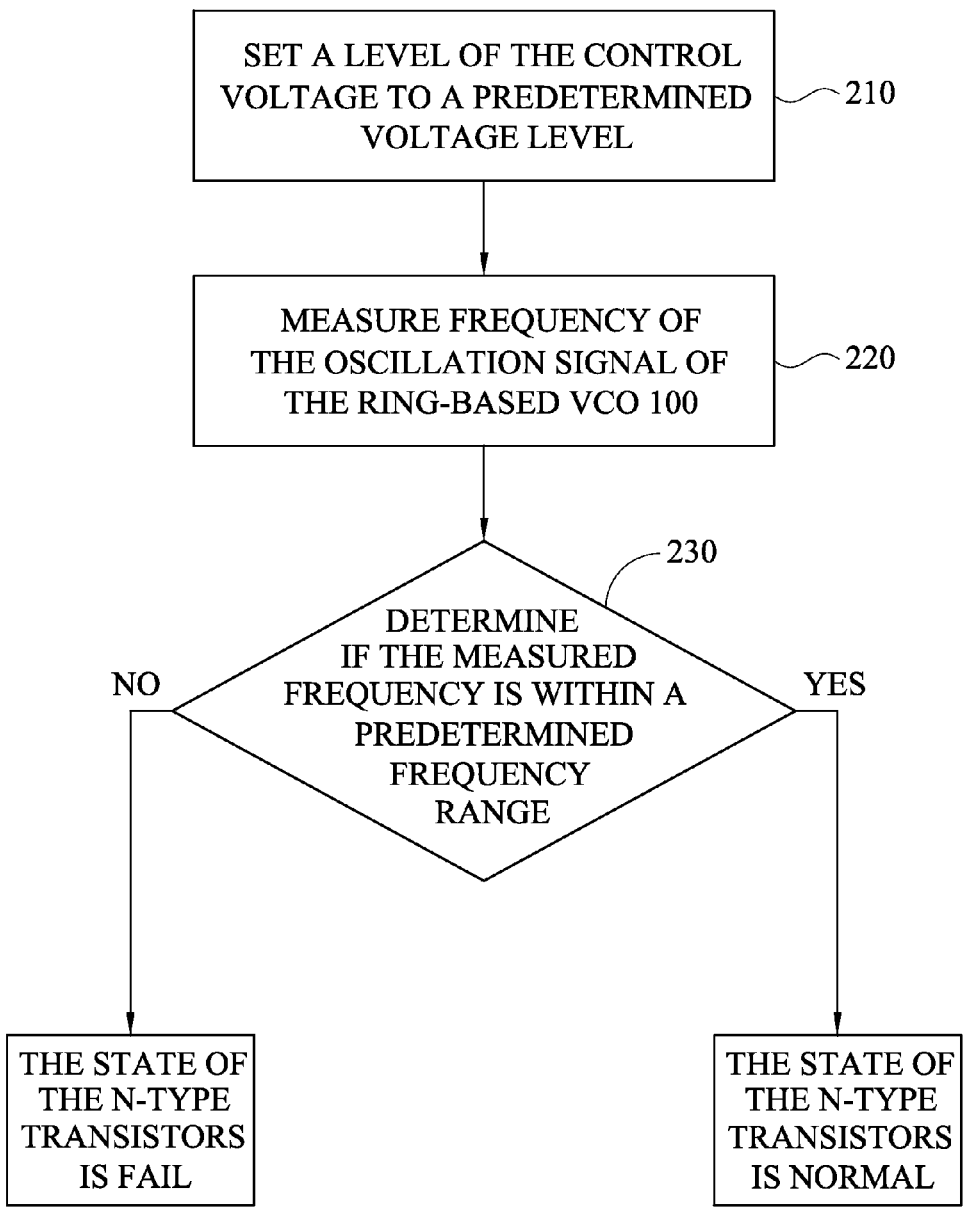
FIG. 2 is a flow chart of a method illustrating check mechanism of the ring-based VCO in accordance with various embodiments of the present disclosure.

FIG. 2 is a flow chart of a method 200 illustrating check mechanism of the ring-based VCO 100 in accordance with various embodiments of the present disclosure. The method 200 is used to determine if the N-type transistor of the ring-based VCO 100 is failed.

The method 200 begins at operation 210. In operation 210, the level of the control voltage Vctrl+ is set to a predetermined voltage level. In operation 220, the frequency of the oscillation signal of the ring-based VCO 100 is measured. The measured frequency of the oscillation signal of the ring-based VCO 100 is converted to a period time. In this case, it is assumed that the characteristics (such as delay time) of all the N-type transistors of the ring-based VCO 100 are the same, and the characteristics of all the P-type transistors of the ring-based VCO 100 are the same. Therefore, the time period of the oscillation signal of the ring-based VCO 100 can be represented by the following equation (1):

$$T_{NRing} = 2N*(M*tn + 2tp + tn) \tag{1}$$

where $T_{NRing}$ is the time period of the oscillation signal of the ring-based VCO 100; N is the number of the inverter circuits; M is the number of the delaying transistors of each of the inverter circuits; tn is a delay time of a N-type transistor cell (such as the transistor 112a); tp is a delay time of a P-type transistor cell (such as the transistor 114a). For illustration with respect to FIG. 1, N is 2, and M is 4.

The number of the inverter circuits and the number of the delaying transistors of each of the inverter circuits are given for illustrative purposes. Other numbers of the inverter circuits and the delaying transistors of each of the inverter circuits are within the contemplated scope of the present disclosure.

Further, in the ring-based VCO 100, because the number of the N-type transistors is more than that of the P-type transistor, the difference between tp and tn is ignored, and thus the equation (1) is substantially equivalent to the following equation (2):

$$T_{NRing}=2N*(M+3)*tn \qquad (2)$$

Therefore, it is understood that the period/frequency of the oscillation signal is in proportion to the delay time of the N-type transistor.

In operation 230, if the measured frequency of the oscillation signal of the ring-based VCO 100 is within a predetermined frequency range is determined. The predetermined frequency range is determined in accordance with a predetermined frequency and a predetermined tolerance range. The predetermined frequency is a standard frequency of the ring-based VCO 100 when the ring-based VCO 100 is controlled by the control voltage Vctrl+ with the predetermined voltage level.

When the measured frequency of the oscillation signal of the ring-based VCO 100 is not within a predetermined frequency range, the state of the N-type transistor of the ring-based VCO 100 is determined to be failed. In contrast, when the measured frequency of the oscillation signal of the ring-based VCO 100 is within a predetermined frequency range, the state of the N-type transistor of the ring-based VCO 100 is determined to be normal.

It is noted that the more delaying transistors used in the delaying unit 112, the higher accuracy of the determination resulted from the method 200 is obtained.

Figure 3:
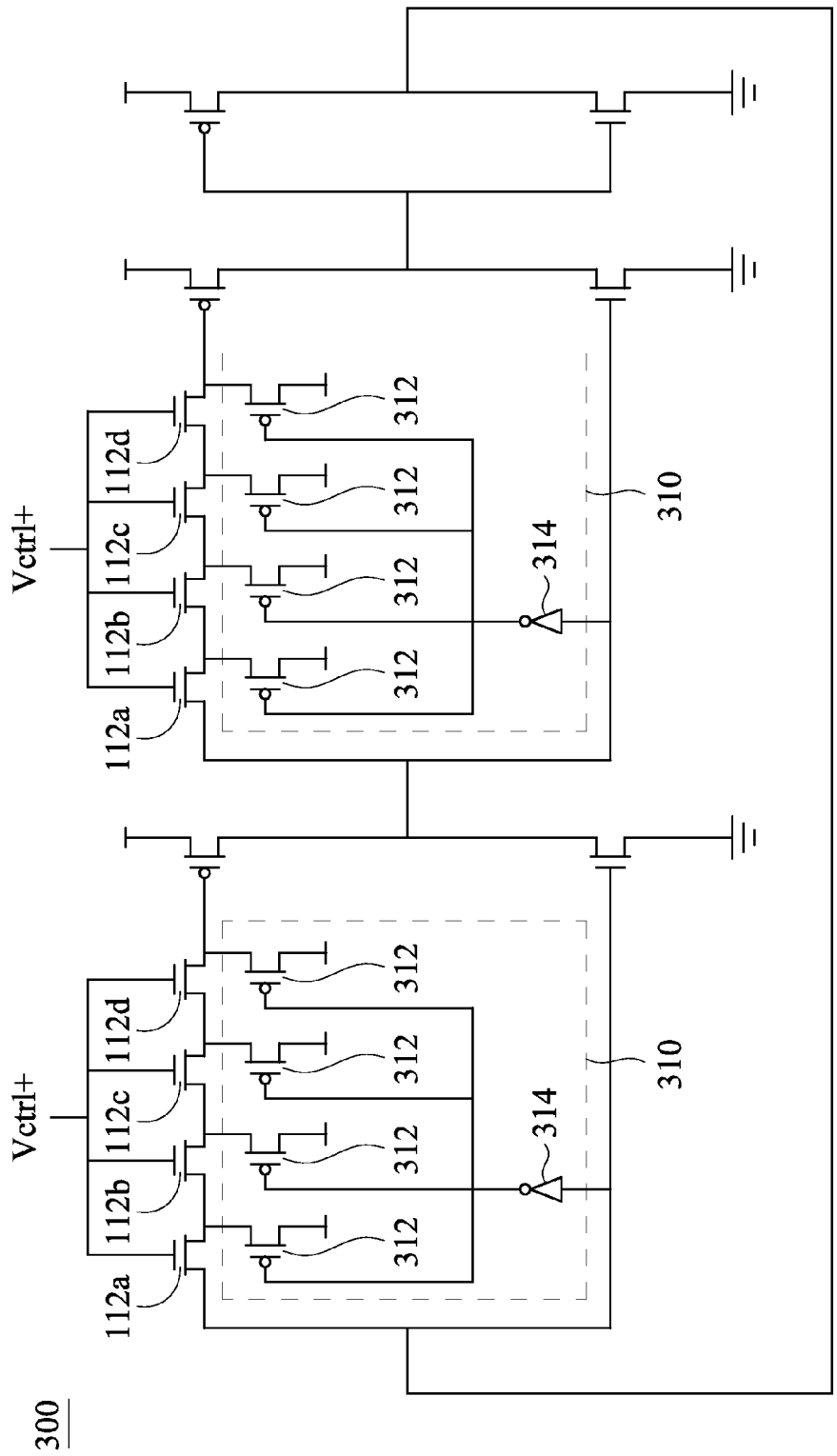
FIG. 3 is a schematic diagram showing a circuit of a ring-based VCO in accordance with various embodiments of the present disclosure.

FIG. 3 is a schematic diagram showing a circuit of a ring-based VCO 300 in accordance with various embodiments of the present disclosure. The ring-based VCO 300 is similar to the ring-based voltage-controlled VCO 100. Compared to the ring-based voltage-controlled VCO 100, the ring-based VCO 300 further includes reset circuits 310. The reset circuit 310 includes voltage-setting transistors 312 and an inverter 314. The voltage-setting transistors 312 are configured to allow a high voltage to be applied on the source electrodes of the delaying transistors 112a-112d.

As shown in FIG. 3, the voltage-setting transistors 312 are electrically connected to the source electrodes of the delaying transistors 112a-112d in a one to one manner. In some embodiments, the number of the voltage-setting transistors 312 is substantially equal to that of the delaying transistors. In some other embodiments, the number of the voltage-setting transistors 312 is smaller than that of the delaying transistors. The inverter 314 is electrically connected between the gates of the voltage-setting transistors 312 and the drain electrode of the delaying transistor 112a. For this illustration, an output terminal of the inverter 314 is electrically connected to gates of the voltage-setting transistors 312, and an input terminal of the inverter 314 is electrically connected to the drain electrode of the delaying transistor 112a.

In some embodiments, when a logic "1" signal passes through the delaying transistors 112a-112d, each of the delaying transistors 112a-112d decreases the voltage level of the logic "1" signal. To prevent the logic "1" signal from being erroneously identified as a logic "0" signal, the voltage-setting transistors 312 pull up the voltages of the source electrodes of the delaying transistors 112a-112d to ensure that the voltage level of the logic "1" signal is higher than a logic "1" verify level.

Figure 4:
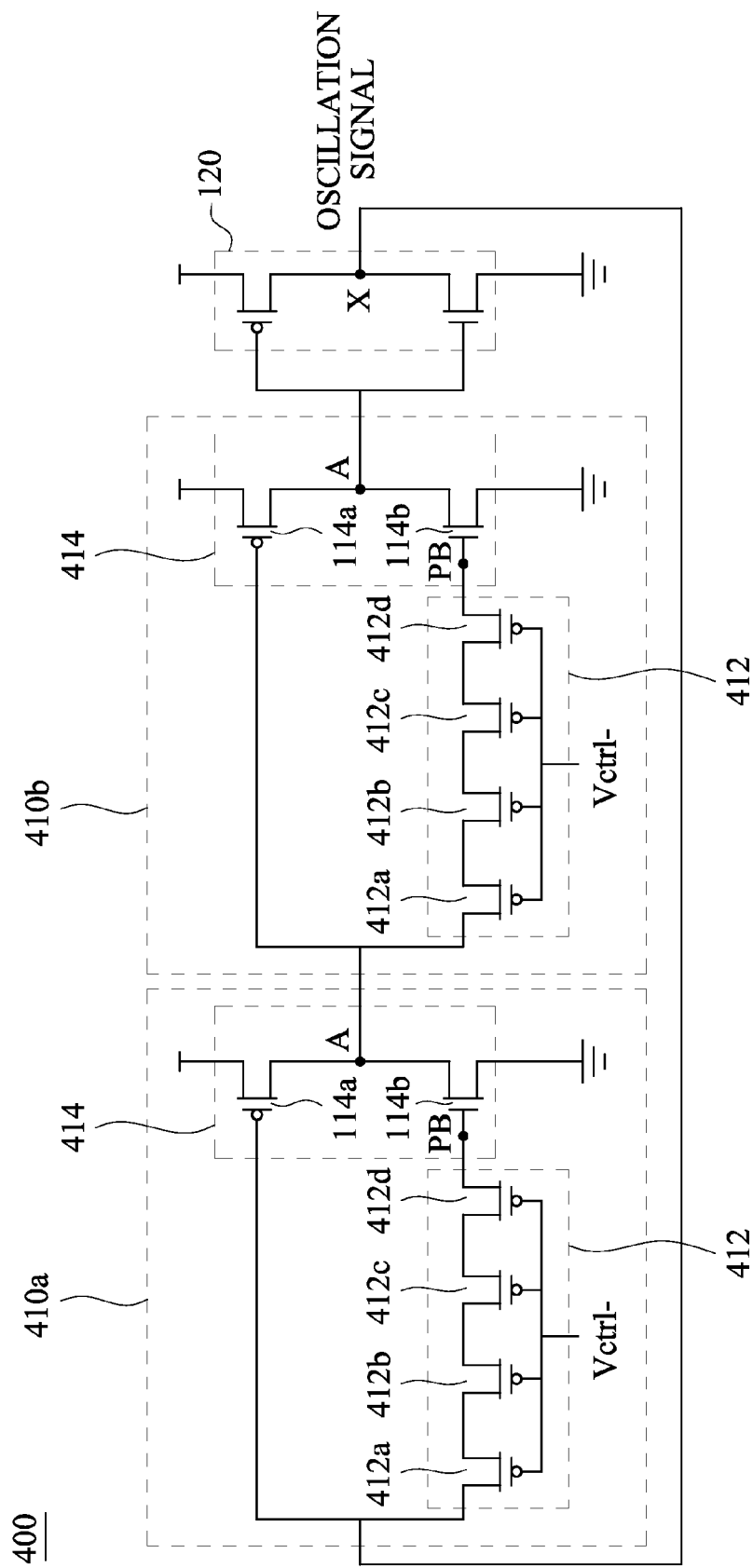
FIG. 4 is a schematic diagram showing a circuit of a ring-based voltage-controlled VCO in accordance with various embodiments of the present disclosure.

FIG. 4 is a schematic diagram showing a circuit of a ring-based voltage-controlled VCO 400 in accordance with various embodiments of the present disclosure. The ring-based VCO 400 includes inverter circuits 410a-410b and the output stage 120, in which the inverter circuits 410a-410b and the output stage 120 are electrically connected in series. Compared to the ring-based VCO 100, in the ring-based VCO 400, a delaying unit 412 of each of the inverter circuits 410a-410b includes P-type delaying transistors 412a-412d.

The delaying transistors 412a-412d of the delaying unit 412 are electrically connected in series and gate electrodes of the delaying transistors 412a-412d are configured to receive a control voltage Vctrl−. The control voltage Vctrl− is used to control the frequency of an oscillation signal outputted by the ring-based VCO 400. For this illustration, the control voltage Vctrl− is a low voltage to turn on the delaying transistors 412a-412d of the delaying unit 412.

Figure 4A:
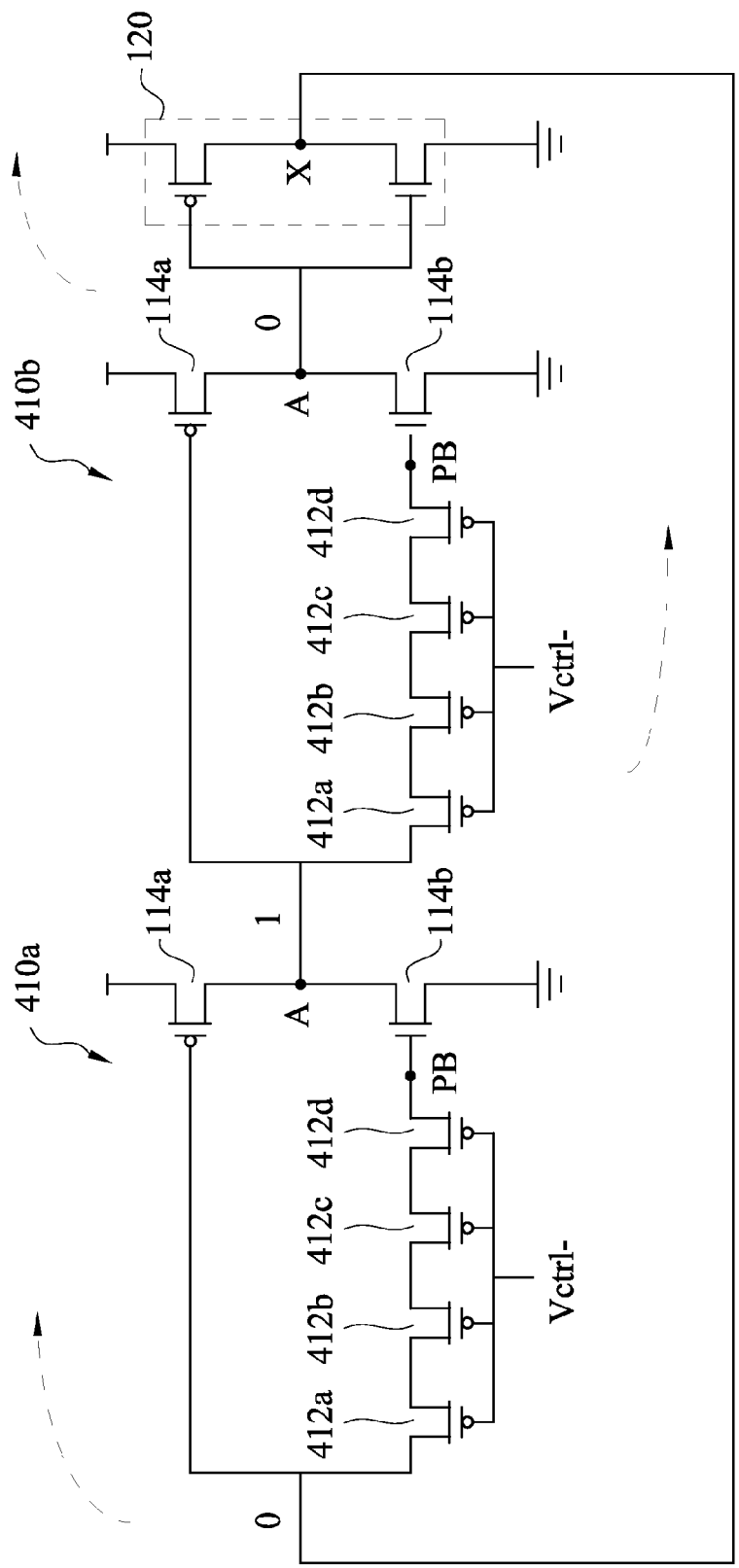
FIG. 4A and FIG. 4B are diagrams showing the operations of the ring-based VCO in accordance with various embodiments of the present disclosure.
Figure 4B:
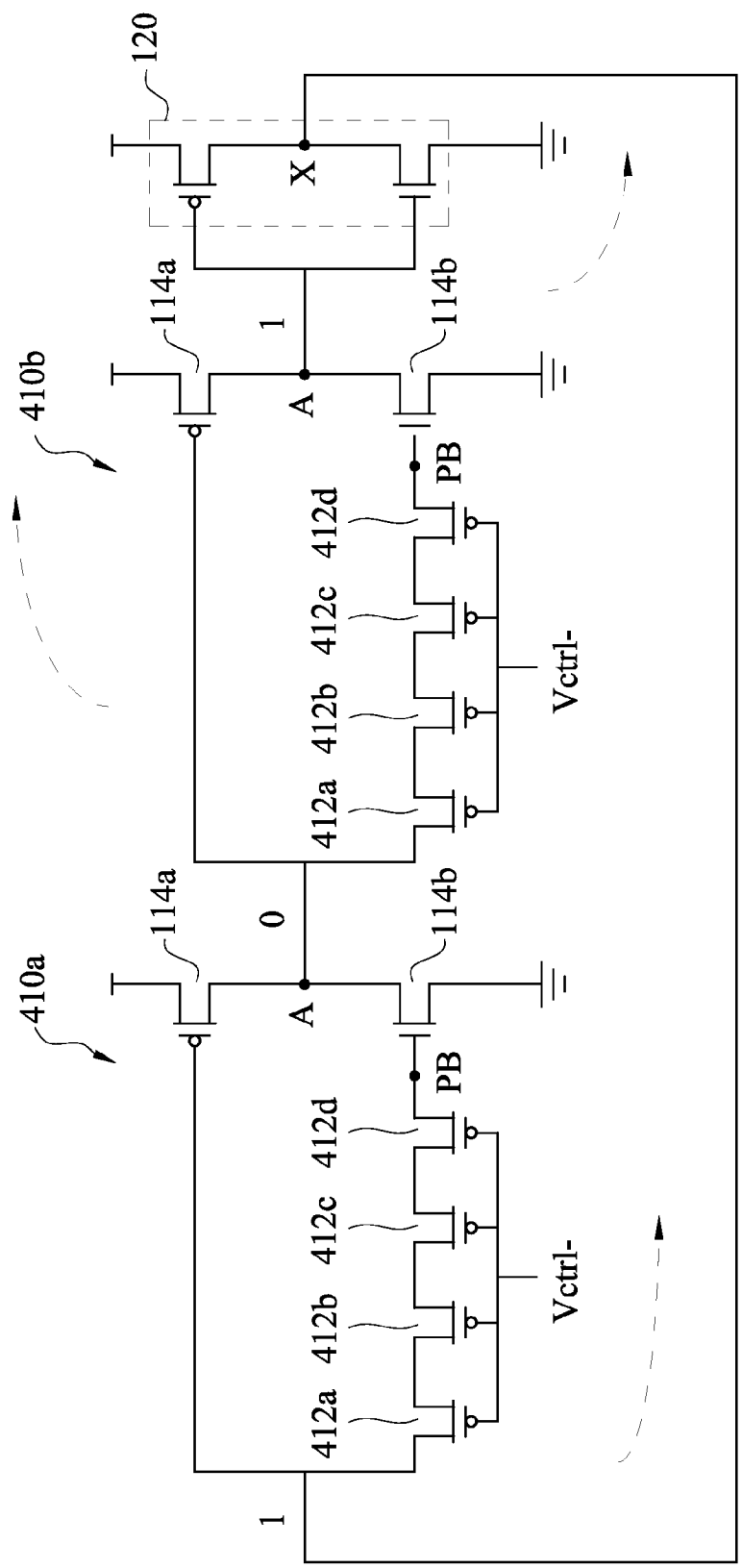

FIG. 4A and FIG. 4B are diagrams showing the operations of the ring-based VCO 400 in accordance with various embodiments of the present disclosure. As shown in FIG. 4A, when a logic "0" signal is inputted to the inverter circuit 410a, the logic "0" signal is applied on a source electrode of the delaying transistor 412a of the inverter circuit 410a, and the logic "0" signal is then delayed by the delaying transistors 412a-412d. The delayed logic "0" signal is presented at a node PB where a drain electrode of the delaying transistor 412d and a gate electrode of the N-type transistor 114b are connected. In this case, because gate electrodes of the P-type transistor 114a and the N-type transistor 114b receive the delayed logic "0" signal and the logic "0" signal respectively, the P-type transistor 114a is turned on and the N-type transistor 114b is turned off, thereby generating a logic "1" signal at the node A of the inverter circuit 110a.

Thereafter, the logic "1" signal is inputted to the inverter circuit 410b. The logic "1" signal is applied on the source electrode of the delaying transistor 412a of the inverter circuit 410b, and the logic "1" signal is then delayed by the delaying transistors 412a-412d. The delayed logic "1" signal is presented at the node NB. In this case, because the gate electrodes of the P-type transistor 114a and the N-type transistor 114b receive the delayed logic "1" signal and the logic "1" signal respectively, the P-type transistor 114a is turned off and the N-type transistor 114b is turned on, thereby generating a logic "0" signal at the node A of the inverter circuit 410b.

Thereafter, the logic "0" signal is inputted to the output stage 120. For this illustration, the output stage 120 is an inverter. Thus, the logic "0" signal is inverted to generate a logic "1" signal at the node X of the output stage 120 shown in FIG. 4A.

As shown in FIG. 4B, the logic "1" signal at the node X is outputted and sent back to the inverter circuit 410a. When the logic "1" signal is inputted to the inverter circuit 410a, the logic "1" signal is applied on the source electrode of the delaying transistor 412a of the inverter circuit 410a, and the logic "1" signal is then delayed by the delaying transistors 412a-412d. The delayed logic "1" signal is presented at the node NB. In this case, because the gate electrodes of the P-type transistor 114a and the N-type transistor 114b receive the delayed logic "1" signal and the logic "1" signal respectively, the P-type transistor 114a is turned off and the N-type transistor 114b is turned on, thereby generating a logic "0" signal at the node A of the inverter circuit 110a.

Thereafter, the logic "0" signal is inputted to the inverter circuit 410b. The logic "0" signal is applied on the source electrode of the delaying transistor 412a of the inverter circuit 410b, and the logic "0" signal is then delayed by the delaying transistors 412a-412d. The delayed logic "0" signal is presented at the node NB. In this case, because the gate electrodes of the P-type transistor 114a and the N-type transistor 114b receive the delayed logic "0" signal and the logic "0" signal respectively, the P-type transistor 114a is turned on and the N-type transistor 114b is turned off, thereby generating a logic "1" signal at the node A of the inverter circuit 410b.

Thereafter, the logic "1" signal is inputted to the output stage 120, an then the logic "1'" signal is inverted to generate a logic "0" signal at the node X of the output stage 120 shown in FIG. 4B.

As a result, the logic "1" signal and the logic "0" signal are outputted by the output stage 120 periodically, thereby outputting the oscillation signal. Further, the frequency of the oscillation signal is determined in accordance with the control voltage Vctrl−. As shown in FIG. 4A and FIG. 4B, the control voltage Vctrl− is applied on the gated electrodes of the delaying transistors 412a-412d, and thus the time need for the signal to pass through the delaying transistors 412a-412d is determined in accordance with the voltage level of the control voltage Vctrl−. When the voltage level of the control voltage Vctrl− is changed, the frequency of the oscillation signal is changed accordingly.

Figure 5:
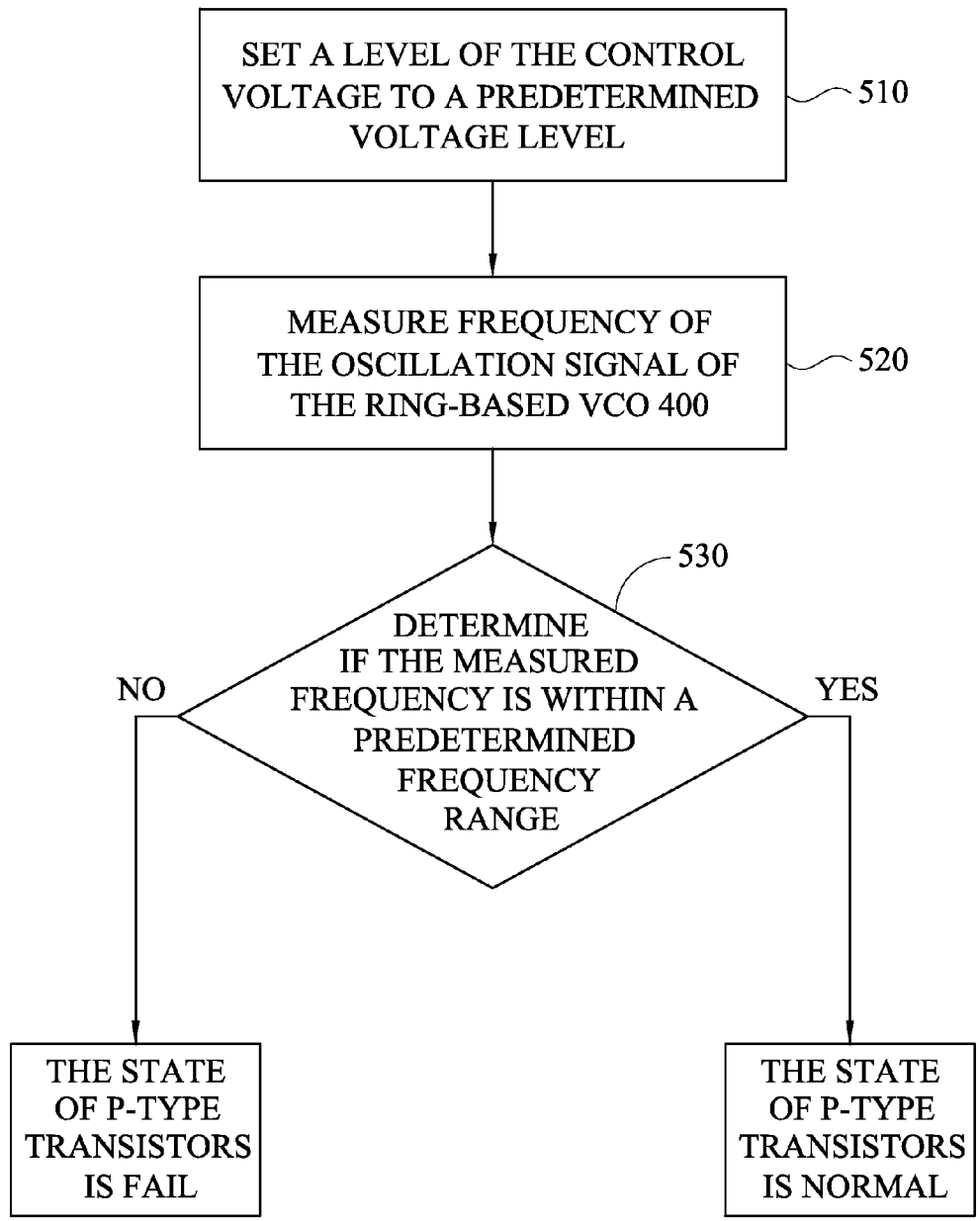
FIG. 5 is a flow chart of a method illustrating check mechanism of the ring-based VCO in accordance with various embodiments of the present disclosure.

FIG. 5 is a flow chart of a method 500 illustrating check mechanism of the ring-based VCO 400 in accordance with various embodiments of the present disclosure. The method 500 is used to determine if the transistors of the ring-based VCO 400 is fail.

The method 500 begins at operation 510. In operation 510, the level of the control voltage Vctrl+ is set to a predetermined voltage level. In operation 520, the frequency of the oscillation signal of the ring-based VCO 400 is measured, and the measured frequency of the oscillation signal of the VCO 400 is converted to a period time. In this case, it is assumed that the characteristics (such as delay time) of all the P-type transistors of the ring-based VCO 400 are considered to be the same with each other, and the characteristics of all the P-type transistors of the ring-based VCO 400 are considered to be the same with each other. Therefore, the time period of the oscillation signal of the ring-based VCO 400 can be represented by the following equation (3):

$$T_{PRing}=2N*(M*tp+2tn+tp) \quad (3)$$

Where $T_{PRing}$ is the time period of the oscillation signal of the ring-based VCO 400; N is the number of the inverter circuits; M is the number of the delaying transistors of each of the inverter circuits; tp is a delay time of a P-type transistor cell (such as the transistor 412a); tn is a delay time of a N-type transistor cell (such as the transistor 114b). For illustration with respect to FIG. 4, N is 2, and M is 4.

The number of the inverter circuits and the number of the delaying transistors of each of the inverter circuits are given for illustrative purposes. Other numbers of the inverter circuits and the delaying transistors of each of the inverter circuits are within the contemplated scope of the present disclosure.

Further, in the ring-based VCO 400, because the number of the P-type transistors is more than that of the N-type transistor, the difference between tp and tn is ignored, and thus the equation (3) is substantially equivalent to the following equation (4):

$$T_{PRing}=2N*(M+3)tp \quad (4)$$

Therefore, it is understood that the period/frequency of the oscillation signal is in proportion to the delay time of the P-type transistor.

In operation 530, if the measured frequency of the oscillation signal of the ring-based VCO 400 is within a predetermined frequency range is determined. The predetermined frequency range is determined in accordance with a predetermined frequency and a predetermined tolerance range. The predetermined frequency is a standard frequency of the ring-based VCO 400 when the ring-based VCO 400 is controlled by the control voltage Vctrl+ with the predetermined voltage level.

When the measured frequency of the oscillation signal of the ring-based VCO 400 is not within a predetermined frequency range, the state of the P-type transistors of the ring-based VCO 400 is determined to be fail. In contrast, when the measured frequency of the oscillation signal of the ring-based VCO 400 is within a predetermined frequency range, the state of the P-type transistors of the ring-based VCO 400 is determined to be normal.

It is noted that the more delaying transistors used in the delaying unit 412, the higher accuracy of the method 500 is obtained.

Figure 6:
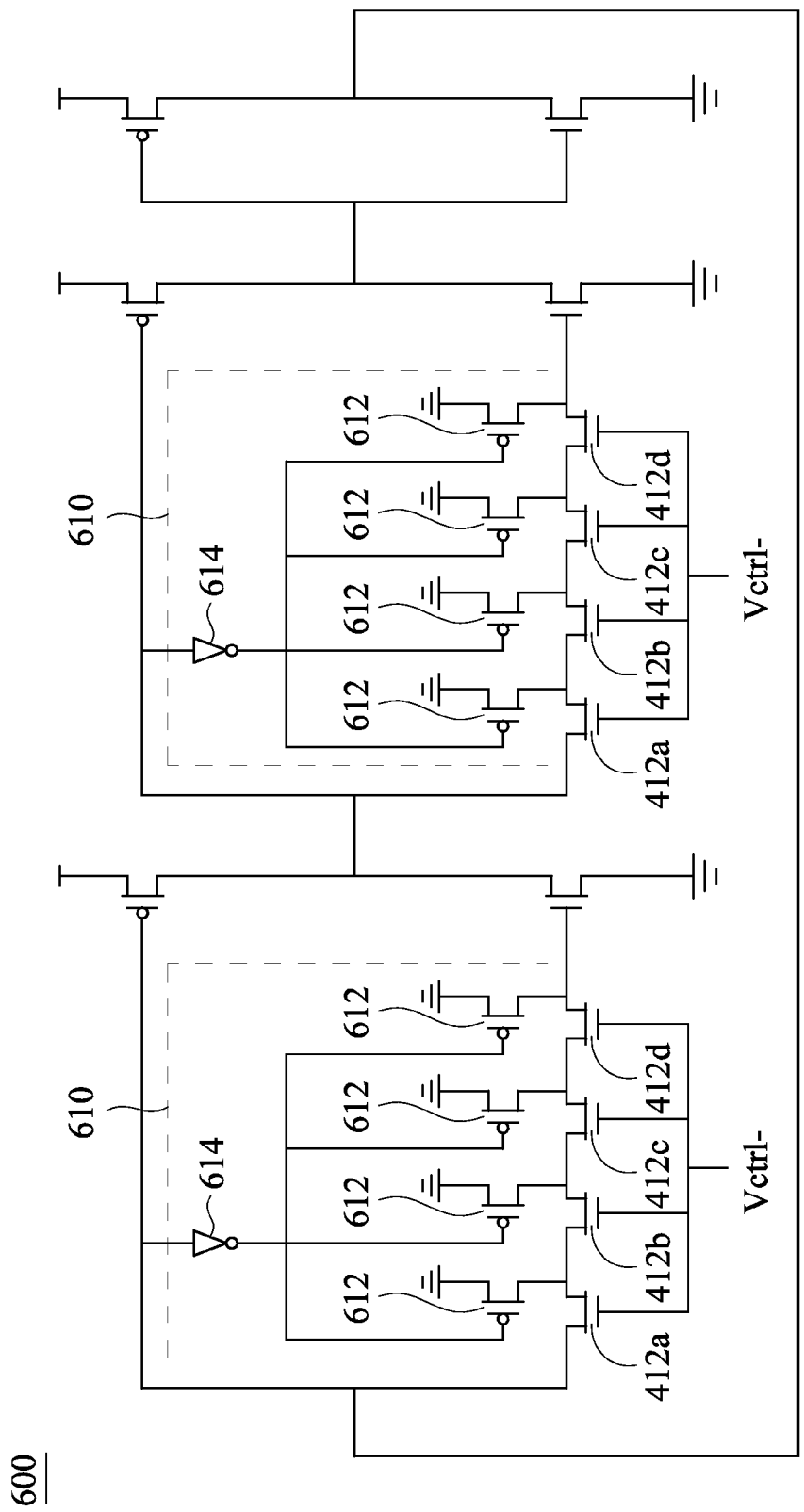
FIG. 6 is a schematic diagram showing a circuit of a ring-based VCO in accordance with various embodiments of the present disclosure.

FIG. 6 is a schematic diagram showing a circuit of a ring-based VCO 600 in accordance with various embodiments of the present disclosure. The ring-based VCO 600 is similar to the ring-based VCO 400. Compared to the ring-based voltage-controlled VCO 400, the ring-based VCO 400 further includes reset circuits 610. The reset circuit 610 includes voltage-setting transistors 612 and an inverter 614. The voltage-setting transistors 612 are configured to allow a low voltage to be applied on the drain electrodes of the delaying transistors 412a-412d.

As shown in FIG. 6, the voltage-setting transistors 612 are electrically connected to the drain electrodes of the delaying transistors 412a-412d in a one to one manner. In some embodiments, the number of the voltage-setting transistors 612 is substantially equal to that of the delaying transistors. In some other embodiments, the number of the voltage-setting transistors 612 is smaller than that of the delaying transistors. The inverter 614 is electrically connected between the gates of the voltage-setting transistors 612 and the source electrode of the delaying transistor 412a. For this illustration, an output terminal of the inverter 614 is electrically connected to gates of the voltage-setting transistors 612, and an input terminal of the inverter 614 is electrically connected to the source electrode of the delaying transistor 412a.

In some embodiments, when a logic "0" signal passes through the delaying transistors 412a-412d, each of the delaying transistors 412a-412d varies the voltage level of the logic "0" signal. To prevent the logic "0" signal from being erroneously identified as a logic "1" signal, the voltage-setting transistors 612 pull down the voltages of the drain electrodes of the delaying transistors 412a-412d to ensure that the voltage level of the logic "0" signal is in a range of a logic "0" verify level.

Figure 7A:
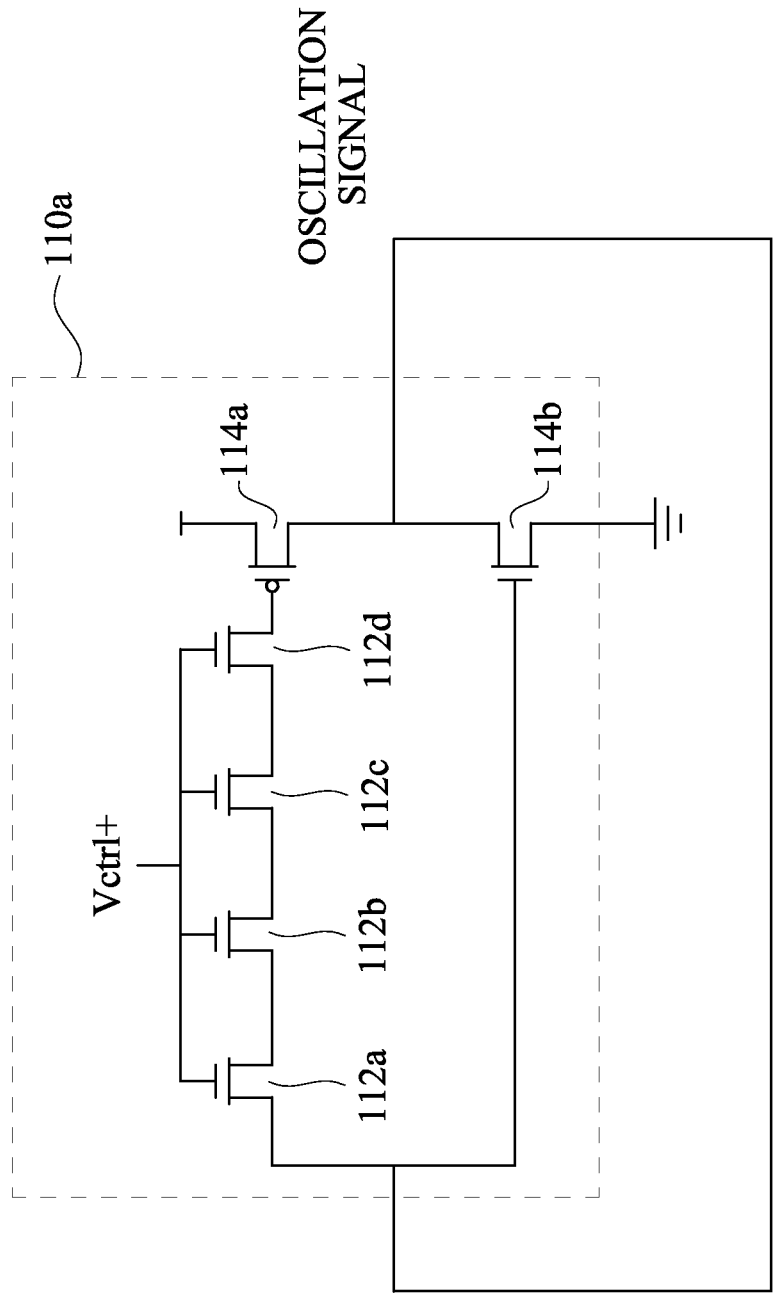
FIG. 7A is schematic diagram showing a circuit of a ring-based VCO in accordance with various embodiments of the present disclosure.
Figure 7B:
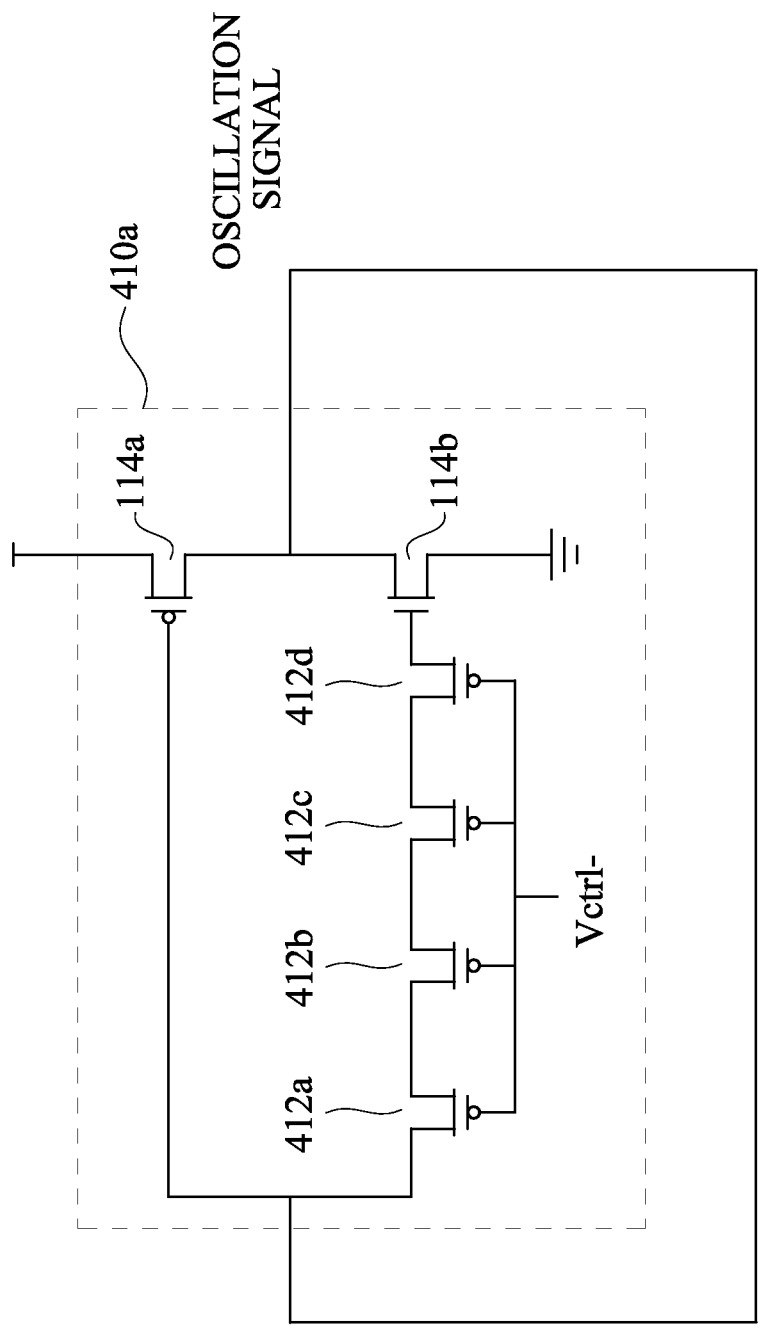
FIG. 7B is schematic diagram showing a circuit of a ring-based VCO in accordance with various embodiments of the present disclosure.

In addition, in various embodiments of the present disclosure, a ring-based VCO includes one inverter circuit 110a or one inverter circuit 410a, as shown in FIG. 7a and FIG. 7b.

Figure 8:
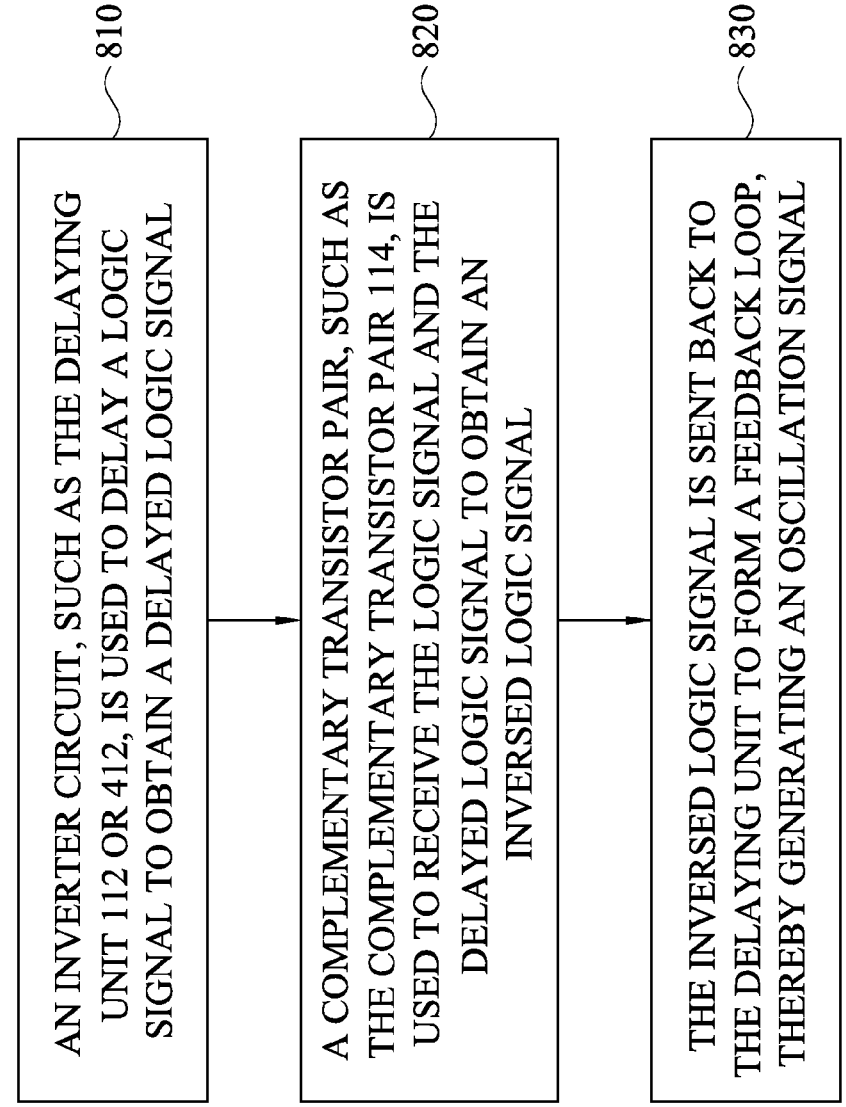
FIG. 8 is a flow chart of a method for generating an oscillation signal by using the ring-based VCO in accordance with various embodiments of the present disclosure.

FIG. 8 is a flow chart of a method 800 for generating an oscillation signal by using the ring-based VCO 100 or 400 in accordance with various embodiments of the present disclosure. In operation 810, an inverter circuit, such as the delaying unit 112 or 412, is used to delay a logic signal to obtain a delayed logic signal. In operation 820, a complementary transistor pair, such as the complementary transistor pair 114, is used to receive the logic signal and the delayed logic signal to obtain an inversed logic signal. In operation 830, the inversed logic signal is sent back to the delaying unit to form a feedback loop, thereby generating an oscillation signal.

In addition, in various embodiments, a reset circuit, such as the reset circuit 310 or 610 is used to apply a predetermined voltage on the terminal of the delaying transistor of the delaying unit 112 or 412.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a voltage-controlled oscillator is disclosed. The voltage-controlled includes a first inverter circuit configured to output an oscillation signal. The first inverter circuit includes a first complementary transistor pair and a first transistor string. The first complementary transistor pair includes a first switch transistor and a second switch transistor. The second switch transistor is electrically connected to the first switch transistor, in which a first terminal of the second switch transistor is electrically connected to a second terminal of the first switch transistor. The first delaying unit includes at least one first delaying transistor. A first terminal of the at least one first delaying transistor is electrically connected to a control terminal of the second switch transistor to receive the oscillation signal. A second terminal of the at least one first delaying transistor is electrically connected to a control terminal of the first switch transistor. A control terminal of the at least one first delaying transistor is configured to receive a voltage control signal.

In some other embodiments, a voltage-controlled oscillator is disclosed. The voltage-controlled oscillator includes an output stage and a plurality of inverter circuits. The output stage is configured to output an oscillation signal. The inverter circuits are electrically connected in series. Each of the plurality of inverter circuits includes a complementary transistor pair and a transistor string. The complementary transistor pair includes a first switch transistor and a second switch transistor. The second transistor is electrically connected to the first switch transistor. A first terminal of the second switch transistor is electrically connected to a second terminal of the first switch transistor. The delaying unit includes at least one delaying transistor. A first terminal of the at least one delaying transistor is electrically connected to a control terminal of the second switch transistor and to the output stage. A second terminal of the at least one delaying transistor is electrically connected to an control terminal of the first switch transistor. A control terminal of the at least one delaying transistor is configured to receive a voltage control signal. The complementary transistor pair of one of the plurality of inverter circuits is electrically connected between the delaying unit of the one of the plurality of inverter circuits and the delaying unit of another of the plurality of inverter circuits.

A method is also disclosed. In the method, at first, a logic signal is delayed by a delaying unit to obtain a delayed logic signal, wherein the delaying unit comprises at least one delaying transistor, and the at least one delaying transistor is controlled by a control voltage. Then, a complementary transistor pair is used to receive the logic signal and the delayed logic signal to obtain an inversed logic signal. The complementary transistor pair includes a first switch transistor and a second switch transistor, and a control terminal of the first switch transistor is configured to receive the delayed logic signal, and a control terminal of the second switch transistor is configured to receive the logic signal. Thereafter, the first complementary transistor pair is enabled to output the delayed logic signal and the inversed logic signal periodically by transmitting the inversed logic signal back to the delaying unit to form a feedback loop.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A voltage-controlled oscillator, comprising:
   a first inverter circuit configured to output an oscillation signal, comprising:
   a first complementary transistor pair, comprising:
   a first switch transistor; and
   a second switch transistor electrically connected to the first switch transistor; and
   a first delaying unit comprising at least one first delaying transistor,
   a first terminal of the at least one first delaying transistor electrically connected to a control terminal of the second switch transistor to receive the oscillation signal;
   a second terminal of the at least one first delaying transistor electrically connected to a control terminal of the first switch transistor; and
   a control terminal of the at least one first delaying transistor configured to receive a voltage control signal.

2. The voltage-controlled oscillator of claim 1, further comprising a second inverter circuit, the second inverter circuit comprising:
   a second complementary transistor pair comprising:
   a third switch transistor; and
   a fourth switch transistor electrically connected to the third switch transistor;
   a second delaying unit comprising at least one second delaying transistor,
   a first terminal of the at least one second delaying transistor electrically connected to a control terminal of the fourth switch transistor and to the first complementary transistor pair;
   a second terminal of the at least one second delaying transistor electrically connected to a control terminal of the third switch transistor; and
   a control terminal of the at least one second delaying transistor configured to receive the voltage control signal.

3. The voltage-controlled oscillator of claim 2, wherein the first inverter circuit and the second inverter circuit are electrically connected in series.

4. The voltage-controlled oscillator of claim 2, wherein the first inverter circuit further comprises a first reset circuit, the first reset circuit comprising:
   at least one first voltage-setting transistor configured to allow a first predetermined voltage to be applied on the second terminal of the at least one first delaying transistor; and
   a first inverter configured to control the at least one first voltage-setting transistor, an output terminal of the first inverter electrically connected to a control terminal of the first voltage-setting transistor, and an input terminal of the first inverter electrically connected to the first terminal of the at least one first delaying transistor.

5. The voltage-controlled oscillator of claim 4, wherein the second inverter circuit further comprises a second reset circuit comprising:
   at least one second voltage-setting transistor configured to allow a second predetermined voltage to be applied on the second terminal of the at least one second delaying transistor; and
   a second inverter configured to control the at least one second voltage-setting transistor, a second terminal of the second inverter electrically connected to a control terminal of the second voltage-setting transistor, and a first terminal of the first inverter electrically connected to the first terminal of the at least one second delaying transistor.

6. The voltage-controlled oscillator of claim 5, wherein the at least one first delaying transistor and the at least one second delaying transistor are all NMOSs (N-Channel Metal-Oxide-Semiconductor Field-effect Transistors), and the at least one first voltage-setting transistor and the at least one second voltage-setting transistor are all PMOSs (P-Channel Metal-Oxide-Semiconductor Field-effect Transistors).

7. The voltage-controlled oscillator of claim 6, wherein the first predetermined voltage and the second predetermined voltage are at a logic high voltage level.

8. The voltage-controlled oscillator of claim 5, wherein the at least one first delaying transistor and the at least one second delaying transistor are all PMOSs, and the at least one first voltage-setting transistor and the at least one second voltage-setting transistor are all NMOSs.

9. The voltage-controlled oscillator of claim 8, wherein the first predetermined voltage and the second predetermined voltage are at a logic low level.

10. The voltage-controlled oscillator of claim 5, wherein the at least one first delaying transistor is at least one NMOS, and the at least one second delaying transistor is at least one PMOS, and the at least one first voltage-setting transistor is at least one PMOS, and the at least one second voltage-setting transistor is at least one NMOS.

11. The voltage-controlled oscillator of claim 10, wherein the first predetermined voltage is at a logic high level, and the second predetermined voltage is a logic low level.

12. The voltage-controlled oscillator of claim 5, wherein the at least one first delaying transistor is at least one PMOS, and the at least one second delaying transistor is at least one NMOS, and the at least one first voltage-setting transistor is at least one NMOS, and the at least one second voltage-setting transistor is at least one PMOS.

13. The voltage-controlled oscillator of claim 12, wherein the first predetermined voltage is at a logic low level, and the second predetermined voltage is at a logic high level.

14. The voltage-controlled oscillator of claim 5, wherein the number of the at least one second delaying transistor is greater than one, and the number of the second voltage-setting transistors is greater than one, and the second voltage-setting transistors are electrically connected to the second delaying transistors in a one to one manner.

15. The voltage-controlled oscillator of claim 4, wherein the number of the at least one the first delaying transistor is greater than one, and the number of the at least one first voltage-setting transistor is greater than one, and the first voltage-setting transistors are electrically connected to the first delaying transistors in a one to one manner.

16. The voltage-controlled oscillator of claim 2, wherein the first inverter circuit and the second inverter circuit are electrically connected in series, and the voltage control signal is used to change a frequency of an output signal of the voltage-controlled oscillator.

17. A voltage-controlled oscillator, comprising:
   an output stage configured to output an oscillation signal; and
   a plurality of inverter circuits electrically connected in series, wherein each of the plurality of inverter circuits comprises:
      a complementary transistor pair, comprising:
         a first switch transistor; and
         a second switch transistor electrically connected to the first switch transistor; and
      a delaying unit comprising at least one delaying transistor, wherein
         a first terminal of the at least one delaying transistor is electrically connected to a control terminal of the second switch transistor and to the output stage; and
         a second terminal of the at least one delaying transistor is electrically connected to an control terminal of the first switch transistor;
         a control terminal of the at least one delaying transistor is configured to receive a voltage control signal;
      wherein the complementary transistor pair of one of the plurality of inverter circuits is electrically connected between the delaying unit of the one of the plurality of inverter circuits and the delaying unit of another of the plurality of inverter circuits.

18. The voltage-controlled oscillator of claim 17, wherein the output stage is a NAND gate circuit or an inverter having complementary transistor pair structure.

19. A method for generating an oscillation signal, comprising:
   delaying a logic signal by a delaying unit to obtain a delayed logic signal, wherein the delaying unit comprises at least one delaying transistor, and the at least one delaying transistor is controlled by a control voltage;
   using a complementary transistor pair to receive the logic signal and the delayed logic signal to obtain an inversed logic signal, wherein the complementary transistor pair comprises a first switch transistor and a second switch transistor, and a control terminal of the first switch transistor is configured to receive the delayed logic signal, and a control terminal of the second switch transistor is configured to receive the logic signal;
   enabling the first complementary transistor pair to output the delayed logic signal and the inversed logic signal periodically by transmitting the inversed logic signal back to the delaying unit to form a feedback loop.

20. The method of claim 19, further comprising: applying a predetermined voltage on the second terminal of the at least one delaying transistor by using a reset circuit.

* * * * *